(12) United States Patent
Li (10) Patent No.: US 9,722,003 B2
(45) Date of Patent: Aug. 1, 2017

(54) BOTTOM EMISSION ORGANIC ELECTROLUMINESCENCE DISPLAY DEVICE, PREPARATION METHOD THEREOF, AND DISPLAY APPARATUS

(71) Applicant: BOE TECHNOLOGY GROUP CO., LTD., Beijing (CN)

(72) Inventor: Xuyuan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/905,130

(22) PCT Filed: Jun. 19, 2015

(86) PCT No.: PCT/CN2015/081918
§ 371 (c)(1),
(2) Date: Jan. 14, 2016

(87) PCT Pub. No.: WO2016/119378
PCT Pub. Date: Aug. 4, 2016

(65) Prior Publication Data
US 2016/0218161 A1 Jul. 28, 2016

(30) Foreign Application Priority Data

Jan. 27, 2015 (CN) .......................... 2015 1 0041448

(51) Int. Cl.
*H01L 27/32* (2006.01)
*H01L 51/52* (2006.01)

(52) U.S. Cl.
CPC ...... *H01L 27/3244* (2013.01); *H01L 27/3241* (2013.01); *H01L 27/3258* (2013.01); *H01L 51/5275* (2013.01)

(58) Field of Classification Search
CPC ............. H01L 27/3244; H01L 27/3241; H01L 27/3258
See application file for complete search history.

(56) References Cited

U.S. PATENT DOCUMENTS

| 2006/0103321 A1 | 5/2006 | Bechtel et al. |
| 2007/0090457 A1 | 4/2007 | Lee et al. |
| 2014/0138641 A1 | 5/2014 | Yi |

FOREIGN PATENT DOCUMENTS

| CN | 101764146 A | 6/2010 |
| CN | 102299229 A | 12/2011 |

(Continued)

OTHER PUBLICATIONS

Search Report and Written Opinion Mailed Oct. 16, 2015 from State Intellectual Property Office of the P.R. China.
(Continued)

*Primary Examiner* — Douglas Menz
(74) *Attorney, Agent, or Firm* — Dilworth & Barrese, LLP.; Michael J. Musella, Esq.

(57) ABSTRACT

A bottom emission organic electroluminescence display, a preparation method thereof, and a display apparatus are provided. The display includes a base substrate (100), and at least one dielectric thin film layer group (200) and a thin film transistor (300) that are successively arranged on the base substrate; each dielectric thin film layer group (200) comprising at least two stacked dielectric thin film layers (201, 202, 203), the refractive indices of which are increased progressively from the base substrate towards the thin film transistor. Because at least one group of at least two stacked dielectric thin film layers, the refractive indices of which are increased progressively from the base substrate towards the thin film transistor, are added between the base substrate and the thin film transistor, not only the reflectance of the surface of the metal layers contained in the thin film transistor (300)

(Continued)

may be decreased, but also the loss rate of the emitted light may be decreased, thereby improving the image quality and display effect.

18 Claims, 4 Drawing Sheets

(56) References Cited

FOREIGN PATENT DOCUMENTS

| | | |
|---|---|---|
| CN | 102708800 A | 10/2012 |
| CN | 102931208 A | 2/2013 |
| CN | 103048825 A | 4/2013 |
| CN | 103325811 A | 9/2013 |
| CN | 103972266 A | 8/2014 |
| CN | 104576706 A | 4/2015 |
| JP | H05182767 A | 7/1993 |

OTHER PUBLICATIONS

Chinese Office Action dated Dec. 28, 2016.
Chinese Office Action dated Jun. 2, 2017.

BOTTOM EMISSION ORGANIC ELECTROLUMINESCENCE DISPLAY DEVICE, PREPARATION METHOD THEREOF, AND DISPLAY APPARATUS

TECHNICAL FIELD

The Embodiments of the present invention relate to a bottom emission organic electroluminescence display device, a preparation method thereof, and a display apparatus.

BACKGROUND

An organic electroluminescence display device (OLED, Organic light-emitting device) is a device in which organic semiconductor light emitting materials are driven by an electric field to emit light by the injection and recombination of current carriers. The light-emitting principle thereof is that: an indium tin oxide (ITO) transparent electrode and a metal electrode are used as the anode and cathode of the display device respectively; electrons and holes which are driven by a certain electric voltage are injected into the electrode and hole transport layers from the cathode and anode respectively, then move to the light emitting layer and are met in the light emitting layer to form excitons which excite the light emitting molecules for radiation relaxation, thereby emitting visible light. OLED has the advantages of being thinner and lighter, active emitting light without the need of backlight, wide view angle, high resolution, high lightness, rapid response, low energy consumption, wide service temperature range, high shock resistance, low cost, being capable of soft display and so on.

SUMMARY

An embodiment of the present invention provides a bottom emission organic electroluminescence display device which comprises: a base substrate, and at least one dielectric thin film layer group and a thin film transistor that are successively arranged on the base substrate. Each dielectric thin film layer group comprises at least two stacked dielectric thin film layers, the refractive indices of which are increased progressively from the base substrate towards the thin film transistor.

In a potential implementation, each dielectric thin film layer group comprises a first dielectric thin film layer and a second dielectric thin film layer arranged on the first dielectric thin film layer.

The second dielectric thin film layer has a refractive index higher than that of the first dielectric thin film layer.

In a potential implementation, a ratio of the refractive index of the first dielectric thin film layer to that of the second dielectric thin film layer is 0.4 to 0.6.

In a potential implementation, the material of the first dielectric thin film layer is selected from the group consisting of SiOx, LiF, MgF, MgO, and a combination thereof.

The material of the second dielectric thin film layer is selected from the group consisting of $SiN_x$, CdS, $CeO_2$, $HfO_2$, $Nb_2O_5$, $PbCl_3$, $Sb_2S_3$, and a combination thereof.

In a potential implementation, the dielectric thin film layers contained in each dielectric thin film layer group have the same optical thickness.

In a potential implementation, the optical thickness of the dielectric thin film layers contained in each dielectric thin film layer group is a quarter of a reference wavelength, wherein the reference wavelength is 550 nanometers.

In a potential implementation, the uppermost dielectric thin film layer of the uppermost dielectric thin film layer group is in contact with a metal layer contained in the thin film transistor.

In a potential implementation, the thin film transistor has a bottom-gate structure, and the metal layer is a gate electrode layer. Alternatively, the thin film transistor has a top-gate structure, and the metal layer is a source/drain electrode layer.

In a potential implementation, the bottom emission organic electroluminescence display device further comprises a pixel electrode layer, a hole injection layer, a hole transport layer, a light emitting layer, an electron transport layer, an electron injection layer and a second electrode which are formed above the thin film transistor.

An embodiment of the present invention further provides a display apparatus comprising the above-mentioned bottom emission organic electroluminescence display device.

An embodiment of the present invention further provides a method for preparing the bottom emission organic electroluminescence display device, which comprises:

forming at least one dielectric thin film layer group and a pattern of a thin film transistor on the base substrate successively, wherein a process of forming each dielectric thin film layer group comprises:

forming at least two dielectric thin film layers, the refractive indices of which are increased progressively in the direction from the base substrate towards the thin film transistor, on the base substrate.

In a potential implementation, a process of forming the pattern of the thin film transistor comprises:

forming a pattern of a gate electrode layer on an uppermost dielectric thin film layer; and forming a pattern comprising a gate insulation layer, an active layer, an etch stop layer, source/drain electrodes, a protection layer and a pixel electrode on the pattern of the gate electrode layer.

In a potential implementation, forming the pattern of the gate electrode layer on the uppermost dielectric thin film layer comprises: depositing a layer of Al/Mo metal thin film on the uppermost dielectric thin film layer; and forming the pattern of the gate electrode layer by exposing-developing etching process.

In a potential implementation, forming the pattern comprising the gate insulation layer, the active layer, the etch stop layer, the source/drain electrodes, the protection layer and the pixel electrode on the pattern of the gate electrode layer comprises: firstly depositing a gate insulation layer on the gate electrode layer; then depositing a layer of oxide semiconductor thin film and forming a pattern of active layer by exposing-developing etching process; depositing an etch stop layer thin film and forming a contact hole pattern for the source/drain electrodes to be in contact with the active layer by exposing-developing etching process; depositing a source/drain electrode metal thin film and forming a pattern of the source/drain electrodes by exposing-developing etching process; depositing the protection layer and then forming a contact hole pattern for the pixel electrode to be in contact with the drain electrode by exposing-developing etching process; depositing a pixel electrode layer and forming a pattern of the pixel electrode by exposing-developing etching process.

BRIEF DESCRIPTION OF THE DRAWINGS

In order to illustrate the technical solutions of the embodiments of the present invention more clearly, the figures of the embodiments are briefly described below. Apparently, the figures described below merely relate to some embodiments of the present invention rather than are limitative of the present invention.

DETAILED DESCRIPTION

To make the object, technical solutions, and advantages of the embodiments of the present invention clearer, the technical solutions of the embodiments of the present invention will be described below in a clearer and more complete way with reference to the figure of the embodiments of the present invention. Apparently, the embodiments described are only part, rather than all of the embodiments of the present invention. Based on the embodiments of the present invention described, all the other embodiments obtained by a person of ordinary skills in the ail without paying inventive work fall into the scope of protection of the present invention.

OLEDs may be classified into two types, bottom emission type and top emission type, based on the light emitting mode, wherein light is emitted from one side of the base substrate of a bottom emission OLED while light is emitted from the top end of a top emission OLED. OLEDs may be classified into two types, passive driven type and active driven type, i.e. direct addressing type and TFT (thin film transistor) matrix addressing type, based on the driving mode. The active driven type is also referred as active matrix type, wherein each light-emitting unit is independently controlled by TFT addressing. A big screen high resolution display usually adopts the active matrix driving mode.

For an AMOLED display screen, the structures of the metal layers contained by TFT, such as the gate electrode layer, the source/drain electrode layer, etc., are made by metal materials which have a very high reflectance. When the AMOLED display screen has a structure of bottom emission type, because the metal layers contained by TFT have a very high reflectance, light from the external environment would be greatly reflected on the surfaces of the metal layers, thereby resulting in an existence of a strong reflected image on the display screen in a dark state. The reflected image would exist even in a display state, which would decrease the image quality and the view effect of the display screen. In order to solve this problem, an existing method is to attach a polarizer on the light-emitting surface of the display screen. This method may decrease the reflection effectively, however, at the same time the lightness of the display screen would be decreased. That is, the attaching of the polarizer would result in the great loss, up to 50%, of the light emitted by the pixel zone, further resulting in the substantial increase of the power consumption of the display screen.

Thus, a technical problem to be solved urgently in the art is to choose a new method for decreasing the reflectance of the surfaces of metal layers while decreasing the loss rate of the emitted light.

The specific embodiments of the bottom emission organic electroluminescence display device, the preparation method thereof and the display apparatus provided in the embodiments of the present invention will be described below in details with reference to the figures.

The thickness and shape of each film layer in the figures do not reflect the actual scale of the bottom emission organic electroluminescence display device, and these are intended only for schematically illustrating the content of the present invention.

Figure 1A:
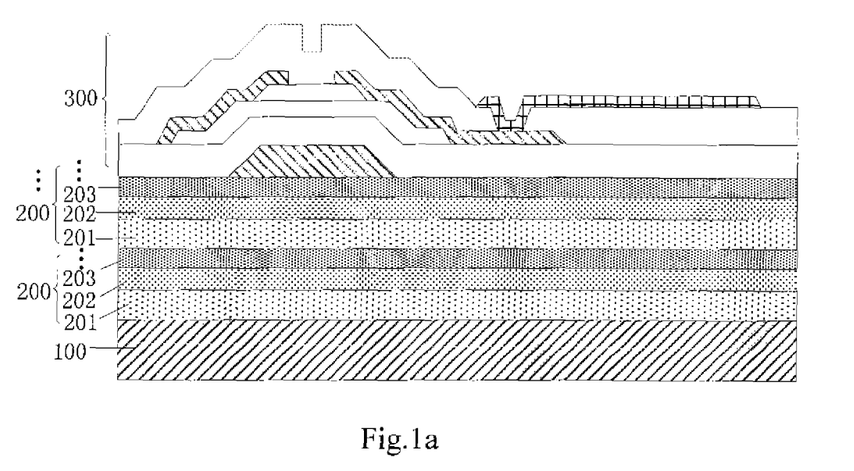
FIGS. 1a to 1d are structural schematic diagrams of an bottom emission organic electroluminescence display device provided in an embodiment of the present invention, respectively.
Figure 1B:
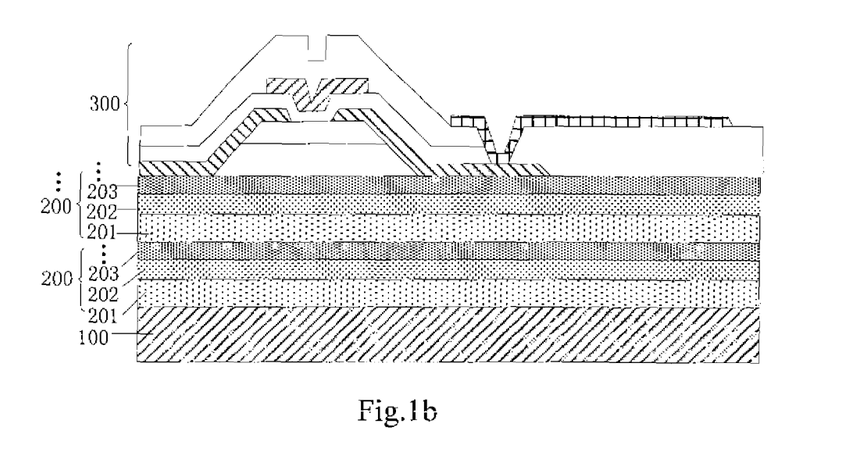

An embodiment of the present invention provides a bottom emission organic electroluminescence display device, as shown in FIGS. 1a and 1b, which comprises: a base substrate 100, at least one dielectric thin film layer group 200 (FIGS. 1a and 1b show two dielectric thin film layer groups 200, respectively) and a thin film transistor 300 successively arranged on the base substrate 100. Each dielectric thin film layer group 200 comprises at least two stacked dielectric thin film layers, the refractive indices of which are increased progressively in the direction from the base substrate towards the thin film transistor. As shown in FIGS. 1a and 1b, each dielectric thin film layer group 200 comprises three dielectric thin film layers 201, 202, 203, wherein, the dielectric thin film layer 201 has a refractive index less than that of the dielectric thin film layer 202, and the dielectric thin film layer 202 has a refractive index less than that of the dielectric thin film layer 203.

It is needed to be noted that the progressive increase in the refractive index of the at least two dielectric thin film layers contained in each dielectric thin film layer group may be identical or distinct (different). That is, the refractive index of one dielectric thin film layer contained in one dielectric thin film layer group may be identical to or different (distinct) from the refractive index of the corresponding dielectric thin film layer contained in another dielectric thin film layer group. For example, as shown in FIGS. 1a and 1b, the refractive index of the dielectric thin film layer 201 contained in each dielectric thin film layer group 200 may be identical or different, and the refractive index of the dielectric thin film layer 202 may also be identical or different, which are not restricted herein.

In the above-mentioned bottom emission organic electroluminescence display device provided in the embodiment of the present invention, at least one group of at least two stacked dielectric thin film layers, the refractive indices of which are increased progressively from the base substrate towards the thin film transistor, are added between the base substrate and the thin film transistor. According to thin film optic theory, the introduction of at least one dielectric thin film layer group of a plurality of dielectric thin film layers which have a refractive index distribution from low to high, the reflectance of the surface of the metal layers contained in the thin film transistor may be decreased and the loss rate of the emitted light may be decreased by 20% to 40% relative to attaching polarizer in the prior art, thereby improving the image quality and display effect.

Figure 1C:
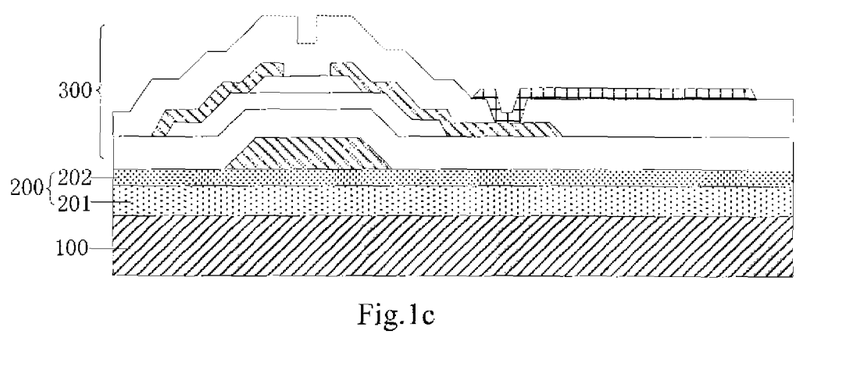
Figure 1D:
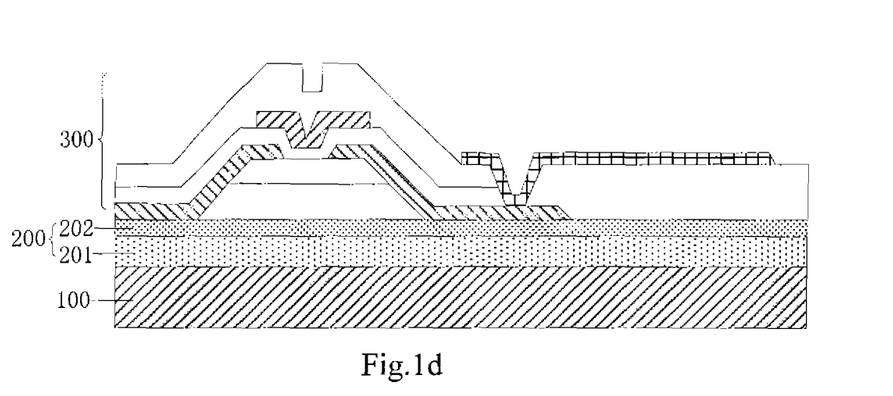

In one embodiment of the present invention, as shown in FIGS. 1c and 1d, each dielectric thin film layer group 200 comprises: a first dielectric thin film layer 201 and a second dielectric thin film layer 202 arranged on the first dielectric thin film layer 201.

The refractive index of the second dielectric thin film layer 202 is greater than that of the first dielectric thin film layers 201. In FIGS. 1c and 1d, only one dielectric thin film layer group is shown.

It is needed to be noted that according to the thin film optic theory, the complex refractive index of the metal layers contained in the thin film transistor 300 is N=n−ik, wherein n is refractive index, and k is absorption coefficient. The reflectance of the light irradiated perpendicularly from air onto the surface of the metal layer is:

$$R_1 = \left|\frac{1-(n-ik)^2}{1+(n-ik)^2}\right| = \frac{(1-n)^2+k^2}{(1+n)^2+k^2}.$$

If a dielectric thin film layer group 200 is added between the base substrate 100 and the thin film transistor 300 and the dielectric thin film layer group 200 comprises a first dielectric thin film layer 201 and a second dielectric thin film layer 202 arranged on the first dielectric thin film layer 201, the refractive index $n_2$ of the second dielectric thin film layer 202 is greater than the refractive index $n_1$ of the first dielectric thin film layers 201, i.e., $n_2>n_1$, for the perpendicular incident light wave, the admittance is:

$$Y = \left(\frac{n_1}{n_2}\right)^2 (n-ik),$$

and
the reflectance is:

$$R_2 = \left|\frac{1-(n_1/n_2)^2(n-ik)}{1+(n_1/n_2)^2(n-ik)}\right|^2 = \frac{[1-(n_1/n_2)^2n]^2+(n_1/n_2)^4k^2}{[1+(n_1/n_2)^2n]^2+(n_1/n_2)^4k^2}.$$

If an incident light irradiates vertically onto the surface of a metal layer contained in the thin film transistor 300, the surface reflectance of the metal layer before adding the dielectric thin film layer group 200 is defined as $F_1$, and the surface reflectance of the metal layer after adding one dielectric thin film layer group 200 is defined as $F_2$. According to thin film optic theory, it can be calculated that the variation of the surface reflectance of the metal layer is varied with the ratio of the refractive index of the first dielectric thin film layer 201 to that of the second dielectric thin film layer 202 of the dielectric thin film layer group 200, i.e., $F_2-F_1$ is varied with $n_1/n_2$. That is to say, the reduction of the surface reflectance of the metal layer is different for different $n_1/n_2$ value.

For example, if the material of the metal layer is metal aluminum Al, the complex refractive index of the metal Al for the light wave of 550 nm wavelength is N=0.82−5.44i. When the light wave irradiates vertically, the surface reflectance of the metal Al can be calculated as $R_1$=91.6% according to the formula of $R_1$. If an LiF thin film having a refractive index $n_1$=1.36 is selected as the first dielectric thin film layer and a ZnS thin film having a refractive index $n_2$=2.35 is selected as the second dielectric thin film layer, the surface reflectance of the metal Al can be calculated as $R_2$=76% according to the formula of $R_2$. The reduction $F_2-F_1$ is 15.6%. Under the consideration of the existing preparation process of thin film transistor, SiOx and SiNx can be prepared as the first and second dielectric thin film layers very easily by PECVD method. The refractive index of SiOx is 1.45, and that of SiNx is 2.1, thus the surface reflectance of the metal Al can be calculated as 81.9% according to the formula of $R_2$, and the reduction $F_2-F_1$ is 9.7%. As known from the obtained data, the reduction of the surface reflectance of the metal layer is different with different $n_1/n_2$ value.

Figure 2:
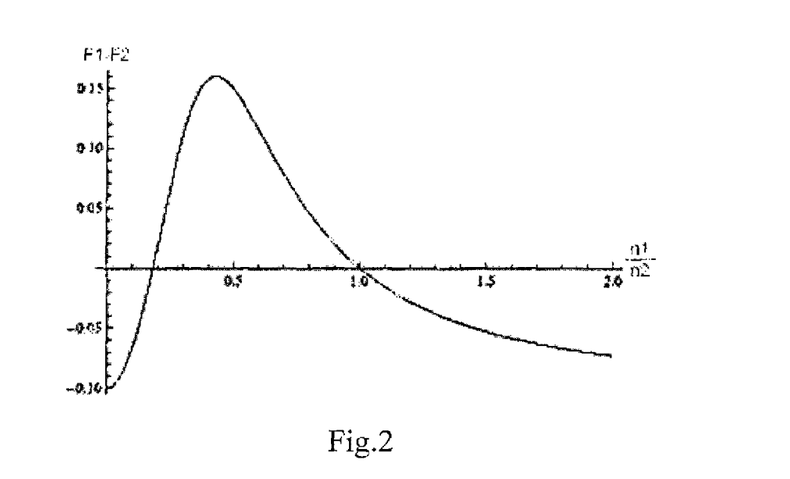
FIG. 2 is a graph of the surface reflectance difference ($F_1$-$F_2$) of the metal layers provided in an embodiment of the present invention which is varied with the ratio of the refractive index of the first dielectric thin film layer to that of the second dielectric thin film layer, wherein $F_1$ is the surface reflectance of the metal layer in case that no dielectric thin film layer group is arranged, and $F_2$ is the surface reflectance of the metal layer in case that a dielectric thin film layer group 200 is arranged.

For example, in order to reduce the surface reflectance of the metal layer contained in the thin film transistor as possible, it is beneficial to select appropriate ratio of the refractive indices of the first and second dielectric thin film layers. As shown in FIG. 2, when the reduction $F_2-F_1$ of the surface reflectance of the metal layer reaches a highest value, i.e., when $F_2-F_1$ equals to or is larger than about 15%, the ratio $n_1/n_2$ of the refractive indices of the first and second dielectric thin film layers can be selected as 0.4 to 0.6 such that the reduction of the surface reflectance of the metal layer can be ensured. Thus the surface reflectance of the metal layer is avoided to be increased or unchanged because of the unsuitable selection of the ratio of the refractive indices of the first and second dielectric thin film layers.

Materials for the first and second dielectric thin film layers have a variety of options. The material of the first dielectric thin film layer may be selected from the group consisting of SiOx, LiF, MgF, MgO, and a combination thereof; and the material of the second dielectric thin film layer may be selected from the group consisting of $SiN_x$, CdS, $CeO_2$, $HfO_2$, $Nb_2O_5$, $PbCl_3$, $Sb_2S_3$, and a the combination thereof. Herein, according to the principle that the ratio of the refractive indices of the first and second dielectric thin film layers can be selected as 0.4 to 0.6, the materials of the first and second dielectric thin film layers can be reasonably selected such that the surface reflectance of the metal layer can be further reduced. The specific selection of the materials of the first and second dielectric thin film layers is not restricted herein.

For example, in order to reduce the surface reflectance of the metal layer as far as possible, the thickness of each dielectric thin film layer contained in each dielectric thin film layer group can be reasonably controlled. Generally, the optical thickness d of each dielectric thin film layer contained in each dielectric thin film layer group 200 should be identical. Because the refractive index of each dielectric thin film layer contained in each dielectric thin film layer group 200 is increased progressively from the base substrate 100 towards the thin film transistor 300, the geometric thickness of each dielectric thin film layer contained in each dielectric thin film layer group 200 should be thinned progressively from the base substrate 100 towards the thin film transistor 300.

For example, in order to reduce the surface reflectance of the metal layer as far as possible, based on the same optical thickness of each dielectric thin film layer contained in each dielectric thin film layer group, the optical thickness d of each dielectric thin film layer contained in each dielectric thin film layer group is generally set as a quarter of a reference wavelength λ, wherein the reference wavelength λ is defined as 550 nanometers, and the reference wavelength λ is a very sensitive wavelength for human eyes.

For example, the uppermost dielectric thin film layer of the uppermost dielectric thin film layer group is in contact with the metal layer contained in the thin film transistor such as the surface reflectance of the metal layer contained in the thin film transistor in direct contact with the uppermost dielectric thin film layer of the uppermost dielectric thin film layer group is further reduced.

For example, as shown in FIGS. 1a and 1c, when the thin film transistor 300 has a bottom-gate structure, the metal layer may be a gate electrode layer. That is, the second dielectric thin film layer 202 is in contact with the gate electrode layer contained in the thin film transistor 300 such that the surface reflectance of the gate electrode layer can be reduced. As shown in FIGS. 1b and 1d, when the thin film transistor 300 has a top-gate structure, the metal layer may be a source/drain electrode layer. That is, the second dielectric thin film layer 202 is in contact with the source/drain electrode layer contained in the thin film transistor 300 such that the surface reflectance of the source/drain electrode layer can be reduced.

For example, the bottom emission organic electroluminescence display device provided in the embodiment of the present invention may generally further include other film layer structures such as light-emitting layer, cathode, anode, and other film structure, and gate line, data line and other structures are generally further formed on the base substrate. These structures may have a plurality of implementations which are not restricted herein.

Based on the same inventive concept, an embodiment of the present invention further provides a method for preparing the above-mentioned bottom emission organic electroluminescence display device. The problem solving principle of the method is similar as that of the above-mentioned bottom emission organic electroluminescence display device, thus as for the embodiments of the method, reference may be made to the embodiments of the above-mentioned bottom emission organic electroluminescence display device, and the repeated features will not be described repeatedly.

The method for preparing the bottom emission organic electroluminescence display device provided in the embodiment of the present invention comprises the following steps:

forming at least one dielectric thin film layer group and a pattern of a thin film transistor on the base substrate successively, wherein a process for forming each dielectric thin film layer group may comprises:

forming at least two dielectric thin film layers on the base substrate, the refractive indices of the at least two dielectric thin film layers are increased progressively in the direction from the base substrate towards the thin film transistor.

Figure 3:
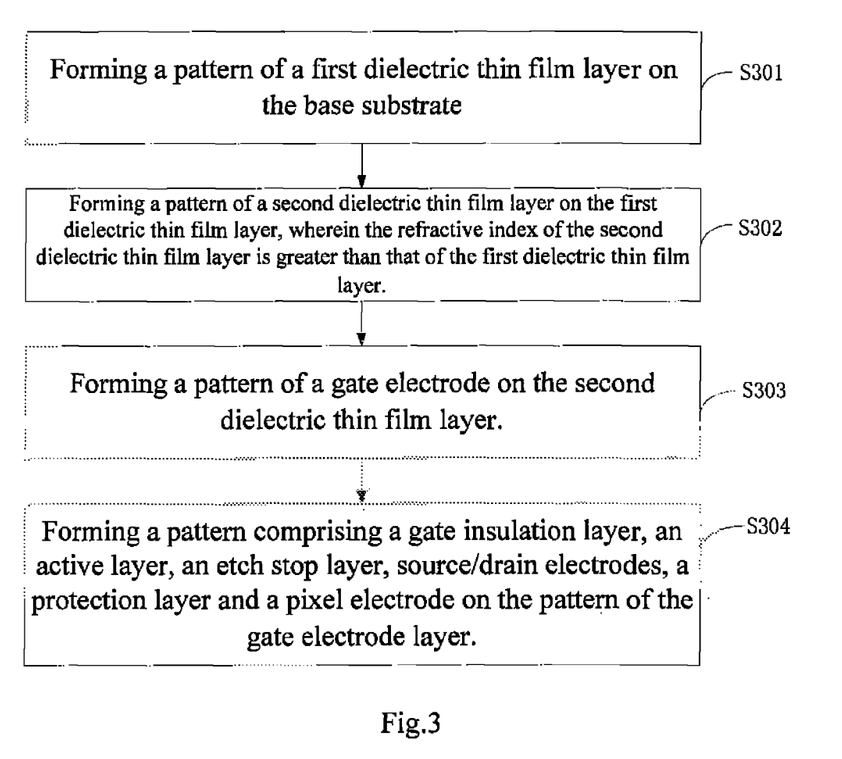
FIG. 3 is a flow chart of a method for preparing a bottom emission bottom gate organic electroluminescence display device provided in an embodiment of the present invention.

The method for preparing the bottom emission bottom gate organic electroluminescence display device, as shown in FIG. 1c, provided in the embodiment of the present invention, is described in details below. For example, as shown in FIG. 3, the method may comprise the following steps:

S301. Forming a pattern of a first dielectric thin film layer on the base substrate.

Figure 4A:
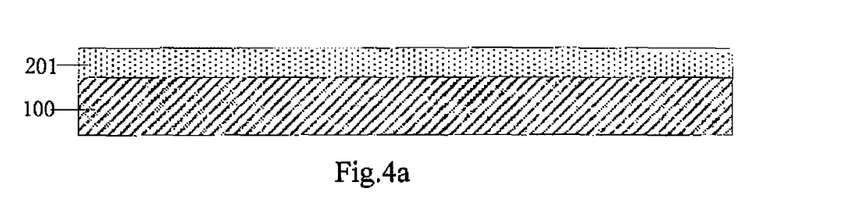
FIGS. 4a-4d are structural schematic diagrams of an bottom emission bottom gate organic electroluminescence display device after an execution of each step of an method for preparing the device provided in an embodiment of the present invention, respectively.

For example, before the deposition of the metal layer, as shown in FIG. 4a, a first dielectric thin film layer 201 having a low refractive index $n_1$ is firstly deposited on the base substrate 100. Taking a wavelength $\lambda=550$ nm which is relatively sensitive for human eyes as a reference wavelength, the optical thickness d of the first dielectric thin film layer 201 having a low refractive index is a quarter of the reference wavelength, i.e., $d=\lambda/4$.

S302. Forming a pattern of a second dielectric thin film layer on the first dielectric thin film layer, wherein the refractive index of the second dielectric thin film layer is greater than that of the first dielectric thin film layer.

Figure 4B:
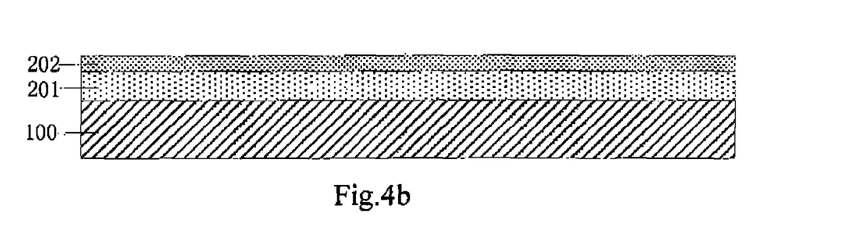

For example, as shown in FIG. 4b, a second dielectric thin film layer 202 having a high refractive index $n_2$ is deposited on the first dielectric thin film layer 201. Taking a wavelength $\lambda=550$ nm which is relatively sensitive for human eyes as a reference wavelength, the optical thickness d of the second dielectric thin film layer 202 having a high refractive index is a quarter of the reference wavelength, i.e., $d=\lambda/4$.

S303. Forming a pattern of a gate electrode layer on the second dielectric thin film layer.

Figure 4C:
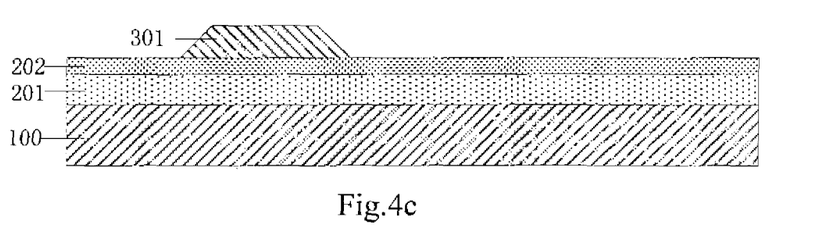

For example, as shown in FIG. 4c, a metal Al/Mo thin film is deposited on the second dielectric thin film layer, and a pattern of a gate electrode layer 301 is formed by exposing-developing etching process.

S304. Forming a pattern comprising a gate insulation layer, an active layer, an etch stop layer, source/drain electrodes, a protection layer and a pixel electrode on the pattern of the gate electrode layer.

Figure 4D:
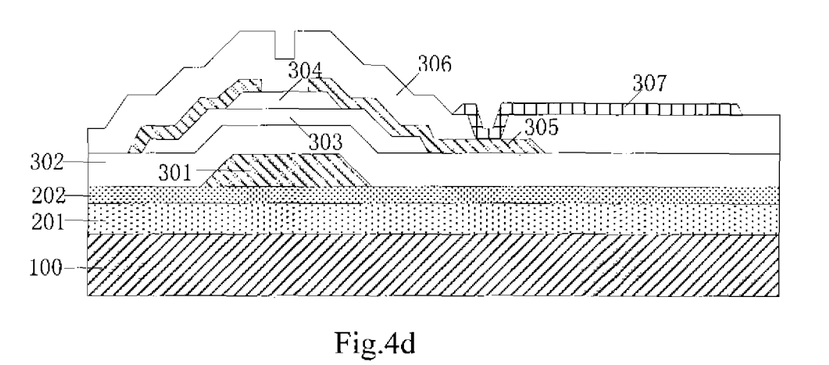

For example, as shown in FIG. 4d, a gate insulation layer 302 is firstly deposited on the gate electrode layer 301. Then a layer of oxide semiconductor IGZO thin film is deposited and a pattern of an active layer 303 is formed by exposing-developing etching process. An etch stop layer 304 thin film is deposited by PECVD method and a contact hole pattern are formed by exposing-etching process for the source/drain electrodes to be in contact with the active layer. A source/drain electrode Mo/Al/Mo metal thin film is deposited by magnetron sputtering method and a pattern of the source/drain electrodes 305 is formed by exposing-etching process. SiOx or SiOx/SiON or SiOx/SiON/SiNx stacked thin film is deposited as a protection layer 306 by PECVD method and then a contact hole pattern is formed by exposing-developing etching process for the pixel electrode to be in contact with the drain electrode. ITO is deposited as a pixel electrode (i.e. an anode of the bottom emission organic electroluminescence display device) by magnetron sputtering method and a pattern of the pixel electrode 307 is formed by exposing-developing etching process. Other functional layers, such as hole injection layer, hole transport layer, light-emitting layer, electron transport layer, electron injection layer, the second electrode, etc., may be further formed on the pixel electrode 307.

Hereto, the above-mentioned bottom emission bottom gate organic electroluminescence display device is prepared by the above-mentioned steps S301-S304 provided in the detailed embodiment.

Based on the same inventive concept, an embodiment of the present invention further provides a display apparatus comprising the above-mentioned bottom emission organic electroluminescence display device provided in an embodiment of the present invention. The display apparatus may be any product or component having display function, such as mobile phone, tablet computer, TV set, display, notebook computer, digital photo frame, navigator, etc. Other essential components of the display apparatus are understood to be included by one skilled in the art and are not stated herein and should not be used for limiting the present invention. As for the embodiments of the display apparatus, reference may be made to the embodiments of the above-mentioned bottom emission organic electroluminescence display device, and the repeated features are not depicted repeatedly.

The embodiments of the present invention provide a bottom emission organic electroluminescence display device, a preparation method thereof, and a display apparatus. The display device comprises: a base substrate, and at least one dielectric thin film layer group and a thin film transistor that are successively arranged on the base substrate. Each dielectric thin film layer group comprises at least two stacked dielectric thin film layers, refractive indices of which are increased progressively from the base substrate towards the thin film transistor. At least one group of at least two stacked dielectric thin film layers, the refractive indices of which are increased progressively from the base substrate towards the thin film transistor, are added between the base substrate and the thin film transistor. According to thin film optic theory, with the introduction of the above-mentioned dielectric thin film layer groups, not only the reflectance of the surface of the metal layers contained in the thin film transistor may be decreased, but also the loss rate of the emitted light may be decreased, thereby improving the image quality and display effect.

The above description is merely exemplary embodiments which are not used for limiting the scope of protection of the present invention which is, however, determined by the attached claims.

The present application claims the priority of the Chinese Patent Application No. 201510041448.2 submitted on Jan. 27, 2015, and the content disclosed in the above Chinese patent application is incorporated by reference as part of this application.

What is claimed is:

1. A bottom emission organic electroluminescence display device, which comprises: a base substrate, and at least one dielectric thin film layer group and a thin film transistor that are successively arranged on the base substrate; each dielectric thin film layer group comprising at least two stacked dielectric thin film layers, refractive indices of which are increased progressively in a direction from the base substrate towards the thin film transistor.

2. The bottom emission organic electroluminescence display device as defined according to claim 1, wherein, each dielectric thin film layer group comprises a first dielectric thin film layer and a second dielectric thin film layer arranged on the first dielectric thin film layer; and
the second dielectric thin film layer has a refractive index higher than a refractive index of the first dielectric thin film layer.

3. The bottom emission organic electroluminescence display device as defined according to claim 2, wherein, a ratio of the refractive index of the first dielectric thin film layer to the refractive index of the second dielectric thin film layer is 0.4 to 0.6.

4. The bottom emission organic electroluminescence display device as defined according to claim 2, wherein, a material of the first dielectric thin film layer is selected from the group consisting of SiOx, LiF, MgF, MgO, and a combination thereof; and
a material of the second dielectric thin film layer is selected from the group consisting of $SiN_x$, CdS, $CeO_2$, $HfO_2$, $Nb_2O_5$, $PbCl_3$, $Sb_2S_3$, and a combination thereof.

5. The bottom emission organic electroluminescence display device as defined according to claim 1, wherein, dielectric thin film layers contained in each dielectric thin film layer group have a same optical thickness.

6. The bottom emission organic electroluminescence display device as defined according to claim 5, wherein, the optical thickness of the dielectric thin film layers contained in each dielectric thin film layer group is a quarter of a reference wavelength; and wherein the reference wavelength is 550 nanometers.

7. The bottom emission organic electroluminescence display device as defined according to claim 1, wherein, an uppermost dielectric thin film layer of an uppermost dielectric thin film layer group is in contact with a metal layer contained in the thin film transistor.

8. The bottom emission organic electroluminescence display device as defined according to claim 7, wherein, the thin film transistor has a bottom-gate structure, and the metal layer is a gate electrode layer; or the thin film transistor has a top-gate structure, and the metal layer is a source/drain electrode layer.

9. The bottom emission organic electroluminescence display device as defined according to claim 1, further comprising a pixel electrode layer, a hole injection layer, a hole transport layer, a light emitting layer, an electron transport layer, an electron injection layer and a second electrode which are formed above the thin film transistor.

10. A display apparatus, comprising the bottom emission organic electroluminescence display device as defined according to claim 1.

11. A method for preparing the bottom emission organic electroluminescence display device as defined according to claim 1, which comprises:
forming the at least one dielectric thin film layer group and a pattern of the thin film transistor on the base substrate successively, wherein a process for forming each dielectric thin film layer group comprises:
forming the at least two dielectric thin film layers, the refractive indices of which are increased progressively in the direction from the base substrate towards the thin film transistor, on the base substrate.

12. The method as defined according to claim 11, wherein, a process for forming the pattern of the thin film transistor comprises:
forming a pattern of a gate electrode layer on an uppermost dielectric thin film layer; and forming a pattern comprising a gate insulation layer, an active layer, an etch stop layer, source/drain electrodes, a protection layer and a pixel electrode on the pattern of the gate electrode layer.

13. The method as defined according to claim 12, wherein, forming the pattern of the gate electrode layer on the uppermost dielectric thin film layer comprises: depositing a layer of Al/Mo metal thin film on the uppermost dielectric thin film layer; and forming the pattern of the gate electrode layer by exposing-developing etching process.

14. The method as defined according to claim 12, wherein, forming a pattern comprising the gate insulation layer, the active layer, the etch stop layer, the source/drain electrodes, the protection layer and the pixel electrode on the pattern of the gate electrode layer comprises: firstly depositing a gate insulation layer on the gate electrode layer; then depositing a layer of oxide semiconductor thin film and forming a pattern of the active layer by exposing-developing etching process; depositing an etch stop layer thin film and forming a contact hole pattern for the source/drain electrodes to be in contact with the active layer by exposing-developing etching process; depositing a source/drain electrode metal thin film and forming a pattern of the source/drain electrodes by exposing-developing etching process; depositing the protection layer and then forming a contact hole pattern for the pixel electrode to be in contact with the drain electrode by exposing-developing etching process; depositing a pixel electrode layer and forming a pattern of the pixel electrode by exposing-developing etching process.

15. The display apparatus as defined according to claim 10, wherein, each dielectric thin film layer group comprises a first dielectric thin film layer and a second dielectric thin film layer arranged on the first dielectric thin film layer; and
the second dielectric thin film layer has a refractive index higher than a refractive index of the first dielectric thin film layer.

16. The display apparatus as defined according to claim 15, wherein, a ratio of the refractive index of the first dielectric thin film layer to the refractive index of the second dielectric thin film layer is 0.4 to 0.6.

17. The method as defined according to claim 11, wherein, each dielectric thin film layer group comprises a first dielectric thin film layer and a second dielectric thin film layer arranged on the first dielectric thin film layer; and the second dielectric thin film layer has a refractive index higher than a refractive index of the first dielectric thin film layer.

18. The method as defined according to claim 17, wherein, a ratio of the refractive index of the first dielectric thin film layer to the refractive index of the second dielectric thin film layer is 0.4 to 0.6.

* * * * *